United States Patent [19]

Mizuno

[11] Patent Number: 5,790,836
[45] Date of Patent: Aug. 4, 1998

[54] APPARATUS FOR SIMULATING DIGITAL SIGNAL PROCESSING CIRCUITS

[75] Inventor: Masanobu Mizuno, Osaka, Japan

[73] Assignee: Matsushita Electric Industrial Co., Ltd., Osaka, Japan

[21] Appl. No.: 702,277

[22] Filed: Aug. 23, 1996

[30] Foreign Application Priority Data

Aug. 25, 1995 [JP] Japan ................... 7-217234

[51] Int. Cl.$^6$ .................................................. G06F 17/50
[52] U.S. Cl. ................................ 395/500; 364/578
[58] Field of Search .................. 395/500; 364/488, 364/578; 371/27

[56] References Cited

U.S. PATENT DOCUMENTS

| | | | |
|---|---|---|---|
| 5,434,869 | 7/1995 | Maekawa et al. | 371/27 |
| 5,535,223 | 7/1996 | Horstmann et al. | 364/488 |
| 5,574,853 | 11/1996 | Barch et al. | 364/578 |
| 5,594,741 | 1/1997 | Kinzelman et al. | 371/27 |
| 5,604,895 | 2/1997 | Raimi | 395/500 |
| 5,703,788 | 12/1997 | Shei et al. | 364/488 |

FOREIGN PATENT DOCUMENTS 5-265793  10/1993  Japan.

*Primary Examiner*—Vincent N. Trans
*Attorney, Agent, or Firm*—McDermott, Will & Emery

[57] ABSTRACT

Test vector storing means outputs data for simulation at a predetermined transfer speed. A signal processor executes the simulation of a digital signal processing circuit by using the data for simulation and outputs the simulation result. Simulation result storing means stores the simulation result input at a predetermined transfer speed. Simulation program generating means generates a simulation program, in advance, which is executed by the signal processor and has throughput that is coincident with the output speed of data of the test vector storing means. Synchronizing means synchronizes the data transfer of the test vector storing means, the execution speed of the signal processor, and the data transfer of the simulation result storing means.

6 Claims, 14 Drawing Sheets

APPARATUS FOR SIMULATING DIGITAL SIGNAL PROCESSING CIRCUITS

BACKGROUND OF THE INVENTION

The present invention relates to a simulation apparatus used for the analysis and verification of a system for processing digital signals such as images, and more particularly to an apparatus for simulating a digital signal processing circuit for verifying the result of functional design of a signal processing circuit obtained when developing a LSI for digital signal processing.

In the development of the LSI for digital signal processing, functional design, logical design, and LSI mask pattern layout design are performed in detail in this order corresponding to a desired signal processing method. The results obtained in circuit design stages are verified by performing simulation suitable for them.

In the functional design, a word length, a data operation method, a data path circuit structure and the like are designed by using a functional description language at the register transfer level or a block diagram input system. By using a circuit simulator at the register transfer level, it is verified whether the result of signal processing which meets the specification of a signal processing method to be intended is obtained or not. The verification of the functional design is performed by evaluating the effects of a finite word length determined as a result of design, a data operation method, in particular, the rounding of the result of operation, a method for processing overflow and the like, and by verifying whether object processing is being performed or not.

A software simulator executed on a general purpose computer such as a work station or a personal computer is used for a circuit simulator at the register transfer level which is utilized for the functional design.

An apparatus for simulating a digital signal processing circuit using a general purpose computer according to the prior art will be described below with reference to the drawings.

FIG. 14 is a block diagram showing the structure of the apparatus for simulating the digital signal processing circuit using the general purpose computer according to the prior art. As shown in FIG. 14, the simulation of the digital signal processing circuit is performed by the simulation apparatus as follows. First of all, a simulation program which is obtained by converting digital signal processing circuit design information described by a hardware description language or the like is generated by simulation program generating means 510, and is loaded into a general purpose processor 511a. Then, the simulation program which is executed on the general purpose processor 511a inputs real signal data such as image data stored in a disk unit 512 which acts as an external storage, that is, a test vector from the disk unit 512 to a memory 511b which acts as an internal storage, and executes the predetermined processing. Thereafter, the result of the processing obtained by execution is stored in the disk unit 512 through the memory 511b.

The general purpose processor 511a can operate at a clock frequency of 10 MHz to 40 MHz to execute processing for the test vector on the memory 511b at a high speed.

For the functional design of the LSI for digital signal processing, in particular, that of a data path block of the LSI for performing image processing and the like, the influences of the word length and the operation method are verified. For this reason, a very mass and large scale test vector corresponding to animation for several seconds is used.

In the apparatus for simulating a digital signal processing circuit according to the prior art, however, asynchronous data transfer occurs frequently between the memory 511b and the disk unit 512 in the case where the mass and large scale test vector is input. Consequently, a data transfer speed is reduced to about 1 MB/sec. For this reason, the general purpose processor 511a is brought into the input-output waiting state. As a result, the simulation cannot be executed efficiently.

In the prior art, there is a cycle based simulation method for ignoring the delay of a combinational circuit portion and evaluating only the register transfer operation which is synchronized with a clock signal to increase the speed of simulation processing. Also in this method, great effects are not produced on a reduction in processing time of the whole simulation because data transfer overhead is increased.

SUMMARY OF THE INVENTION

In consideration of the above-mentioned problems, it is an object of the present invention to simulate a data path of a LSI for digital signal processing using a mass and large scale test vector at a high speed.

In order to accomplish the above-mentioned object, the present invention synchronizes a timing at which data for simulation is transferred from test vector storing means, a speed timing at which the simulation is executed by a signal processor, and a timing at which the simulation result is transferred to simulation result storing means.

The present invention provides an apparatus for simulating a digital signal processing circuit comprising verifying means for verifying the result of design at the register transfer level in a digital signal processing circuit by using a signal processor, the verifying means including test vector storing means for storing data for simulation to output the data for simulation at a predetermined transfer speed, a signal processor for inputting the data for simulation output from the test vector storing means, executing the simulation of the digital signal processing circuit and outputting the simulation result, simulation result storing means for inputting the simulation result output from the signal processor at a predetermined transfer speed to store the input simulation result, simulation program generating means for generating a simulation program which is executed by the signal processor and has throughput that is coincident with the output speed of the data of the test vector storing means, and synchronizing means for synchronizing a timing at which the data for simulation is transferred from the test vector storing means, a speed timing at which the simulation is executed by the signal processor, and a timing at which the simulation result is transferred to the simulation result storing means.

According to the apparatus for simulating a digital signal processing circuit, the simulation program generating means generates a simulation program for executing the operation of a simulated circuit which is obtained as a result of design in a predetermined data input cycle, and the synchronizing means synchronizes the test vector storing means, the signal processor and the simulation result storing means. Consequently, also in the case where enormous data for simulation are processed, the overhead of the data transfer of the test vector storing means and the signal processor is not increased. Therefore, the data for simulation can always be processed at a predetermined data transfer speed. Accordingly, the simulation can be completed in a time that is proportional to the number of data of a test vector. In particular, a predetermined delay is allocated to a data input cycle obtained based on the clock cycle of the simulated signal processing circuit and the data transfer between registers which is synchronized with the clock signal so as to perform the simulation. Consequently, a control mechanism for simulating synchronization of the data transfer between registers is not necessary, and the throughput which is coincident with the transfer speed of input data can be obtained.

In the apparatus for simulating a digital signal processing circuit, it is preferable that the simulation program generating means should generate a simulation program for simulating operation between registers of a data path which is obtained as a result of design of the digital signal processing circuit. Thus, the simulation of the digital signal processing circuit at the register transfer level can be performed surely.

In the apparatus for simulating a digital signal processing circuit, it is preferable that the data path should include a plurality of registers, the signal processor should include a plurality of signal processing units, and the simulation program generating means should include partial data path generating means for dividing the data path for each register to generate a plurality of partial data paths, and unit allocating means for allocating the partial data path to the signal processing unit. Thus, the simulation program generated by the simulation program generating means can surely perform the simulation of the digital signal processing circuit at the register transfer level.

In the apparatus for simulating a digital signal processing circuit, it is preferable that the verifying means should further include register arrangement changing means for changing the arrangement of the registers of the data path which is obtained as a result of design of the digital signal processing circuit. Thus, even if a partial pass which cannot be operated with a delay within an input data cycle exists on the data path of the digital signal processing circuit because of a large quantity of operation, the processing delay can be added and enlarged by integrating the same partial pass and a prior or posterior partial pass when generating the simulation program. Consequently, the simulation of the digital signal processing circuit having a large quantity of operation can also be coped with. As a result, the circuit range to which the simulation apparatus is applied can be expanded.

In the apparatus for simulating a digital signal processing circuit, it is preferable that the verifying means should further include transfer speed adjusting means for adjusting the transfer speed of the data for simulation of the test vector storing means and that of the simulation result of the simulation result storing means. Thus, if it is hard to generate the signal processing program for executing the simulation at a high data transfer speed because of a large quantity of operation for each sample data, the transfer speed can be decreased to generate the simulation program. As a result, the signal processor having the limited operation resources can also perform the simulation irrespective of the scale of the circuit. In addition, the overhead for accessing the test vector and the simulation result data is not caused so that the simulation can be executed at a high speed.

In the apparatus for simulating a digital signal processing circuit, it is preferable that the transfer speed adjusting means should adjust the transfer speed of the data for simulation and that of the simulation result according to the throughput of the simulation program which can be generated by the simulation program generating means. Thus, the simulation can surely be executed corresponding to the scale of the circuit.

BRIEF DESCRIPTION OF THE DRAWINGS

The present invention will be detailed in conjunction with the accompanying drawings wherein:

FIGS. 4(a) to 4(e) show the procedure for program generation of the simulation program generating means of the apparatus for simulating a digital signal processing circuit according to the first embodiment of the present invention, in which FIG. 4(a) is a circuit diagram showing a simulated signal processing circuit, FIG. 4(b) is a diagram showing the division into partial passes of the simulated signal processing circuit, FIG. 4(c) is a diagram showing a partial pass net list of the simulated signal processing circuit, FIG. 4(d) is a diagram showing the structure of signal processing units which are allocated to the partial pass net list of the simulated signal processing circuit, and FIG. 4(e) shows instruction codes for a simulation program which is down loaded into a signal processing unit;

FIGS. 11(a) to 11(c) show the operation of register arrangement changing means of the apparatus for simulating a digital signal processing circuit according to the second embodiment of the present invention, in which FIG. 11(a) is a circuit diagram showing a simulated signal processing circuit, FIG. 11(b) is a circuit diagram showing the simulated signal processing circuit having the register arrangement changed, and FIG. 11(c) is a diagram showing partial pass division of the simulated signal processing circuit having the register arrangement changed;

DETAILED DESCRIPTION OF THE INVENTION (First Embodiment)

A first embodiment of the present invention will be described below with reference to the drawings.

Figure 1:
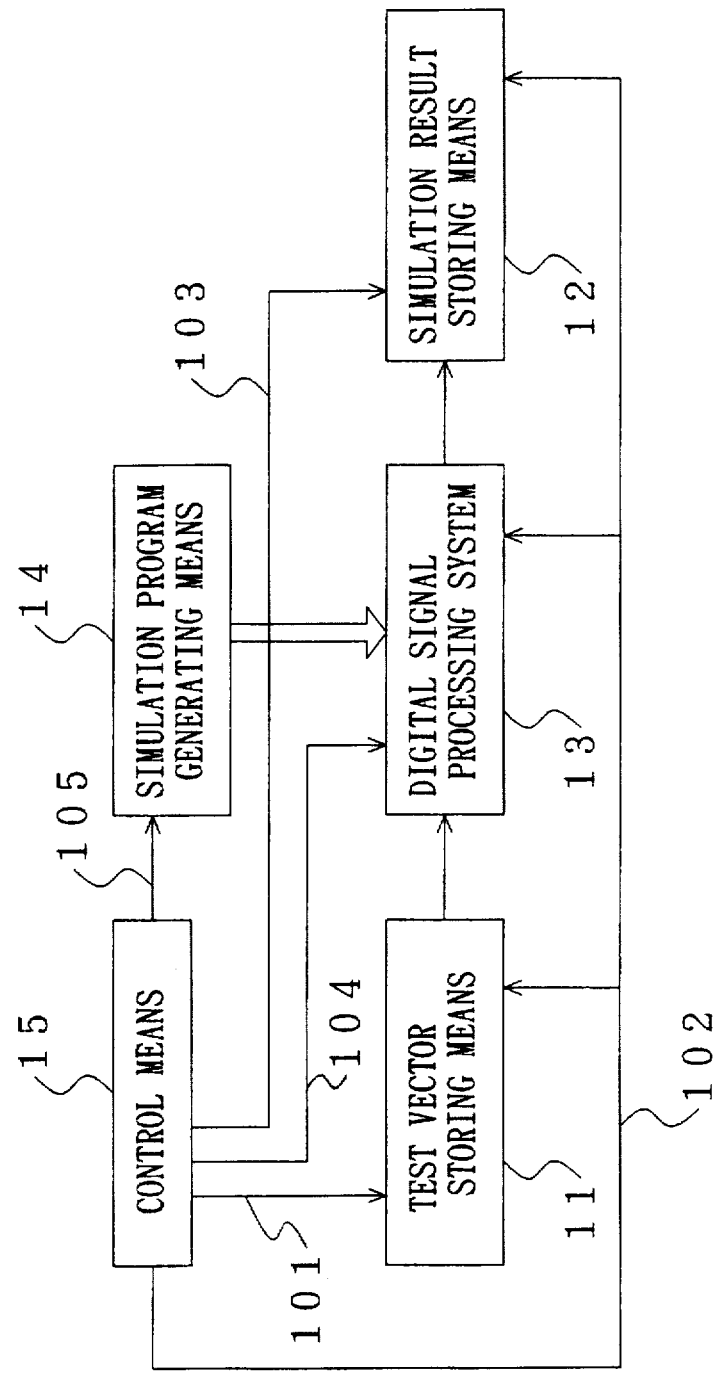
FIG. 1 is a block diagram showing the structure of an apparatus for simulating a digital signal processing circuit according to a first embodiment of the present invention.

FIG. 1 is a block diagram showing the structure of am an apparatus for simulating a digital signal processing circuit according to the first embodiment of the present invention. The simulation apparatus performs the functional simulation of a signal processing circuit by using a plurality of processors for digital signal processing.

As shown in FIG. 1, test vector storing means 11 stores, in advance, a test vector which is data for simulation. When an output control signal 101 is turned on, the test vector storing means 11 synchronizes the stored test vector with a clock signal 102 and outputs the same test vector to an output port every sample data. The test vector storing means 11 has an input port for loading the test vector from the outside, which is implemented by using a field memory utilized for video signal processing or the like.

Simulation result storing means 12 stores simulation result data input to an input port every sample data synchronously with the clock signal 102 when an input control signal 103 is turned on. Furthermore, the simulation result storing means 12 has an output port for referring to the result of simulation, which is implemented by using the field memory in the same manner as the test vector storing means 11.

A digital signal processing system 13 includes a plurality of digital signal processors. When an execution starting signal 104 is turned on, the digital signal processing system 13 executes the programmed signal processing synchronously with the clock signal 102. When the execution starting signal 104 is turned off, the digital signal processing system 13 is reset.

Simulation program generating means 14 inputs a net list whose elements are a register, an arithmetic unit and the like as the result of the functional design at the register transfer level of a data path of the digital signal processing circuit, and generates a simulation program which can be executed by the digital signal processing system 13.

Control means 15 which acts as synchronizing means has an internal counter for counting the number of data of a test vector, and sets the output control signal 101, the input control signal 103 and the execution starting signal 104 to have the same timing according to the count value of the internal counter so that the execution of simulation is controlled.

Figure 2:
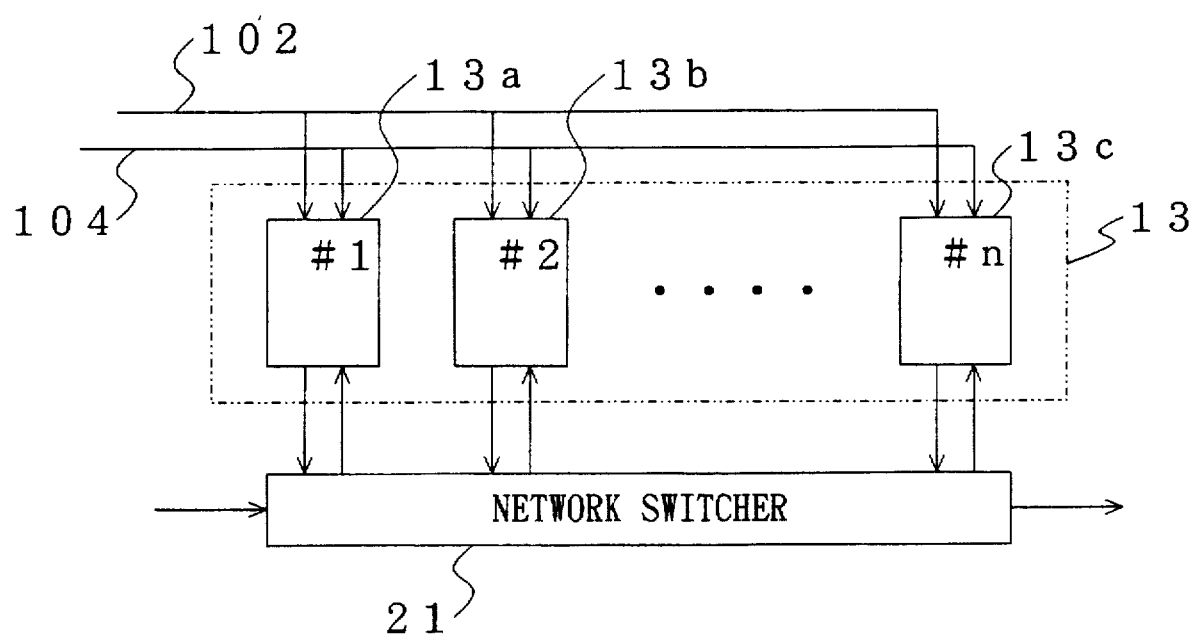
FIG. 2 is a diagram showing the structure of a digital signal processing system of the apparatus for simulating a digital signal processing circuit according to the first embodiment of the present invention.

The structure of the digital signal processing system 13 shown in FIG. 1 will be described below with reference to FIG. 2. As shown in FIG. 2, the digital signal processing system 13 shown in FIG. 1 has n (n is an integer which is equal to or more than 1) signal processing units 13a, 13b, ..., 13c connected in parallel. For example, it is desired that n has a value of 256 or more. The signal processing system 13 shown in FIG. 2 employs Harvard architecture in which a data processing system and an instruction processing system are provided independently, and serves as a multiprocessor system which executes various kinds of data operation in predetermined cycles. When the execution starting signal 104 is turned on, the signal processing units 13a, 13b, ..., 13c start signal processing synchronously with the clock signal 102 to input signal sample data from an input channel, and performs the microprogrammed operation for the input signal sample data and then outputs the result of the operation from an output channel with a processing delay according to the kind of the operation. The input-output channels of the signal processing units 13a, 13b, ..., 13c are connected to one another through a network switcher 21 to mutually perform data transfer. The signal processing units 13a, 13b, ..., 13c include instruction RAMs. A microprogram for simulation is down loaded into the instruction RAM in advance. The network switcher 21 includes a connection control code memory to determine the connection of the input-output channels of the signal processing units 13a, 13b, ..., 13c according to control codes which are down loaded into the connection control code memory in advance.

Figure 3:
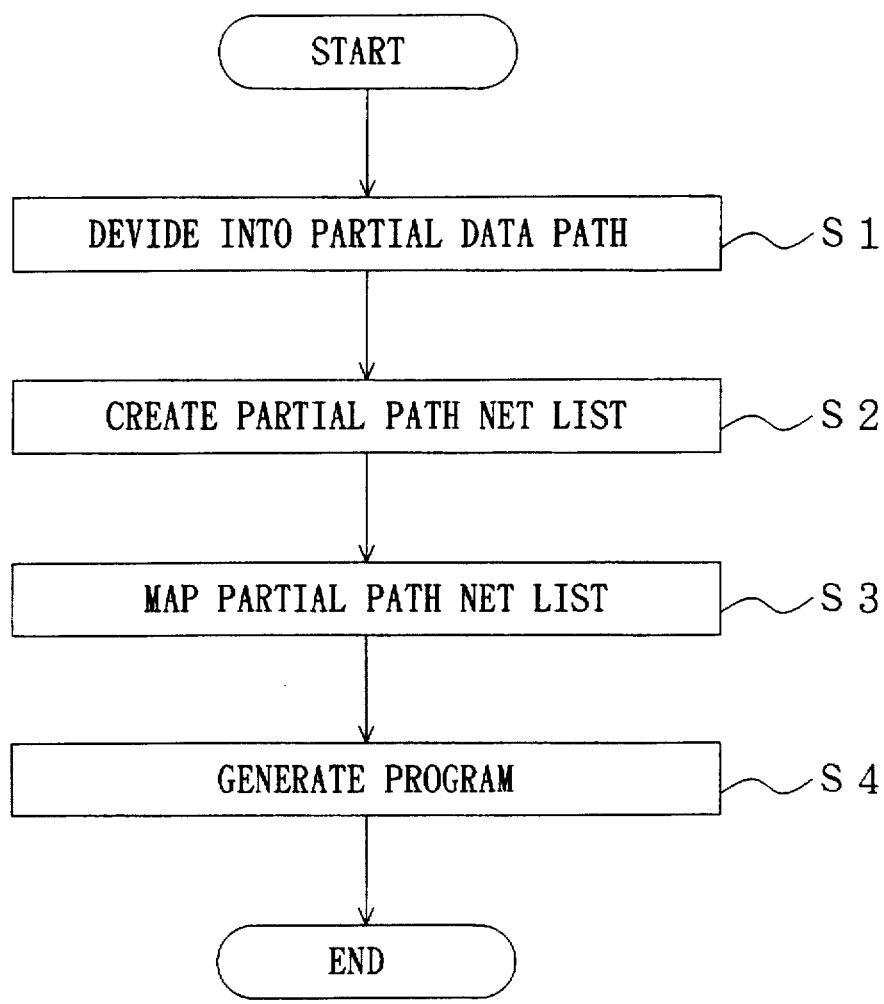
FIG. 3 is a flowchart showing the procedure for program generation of simulation program generating means of the apparatus for simulating a digital signal processing circuit according to the first embodiment of the present invention.
Figure 4:
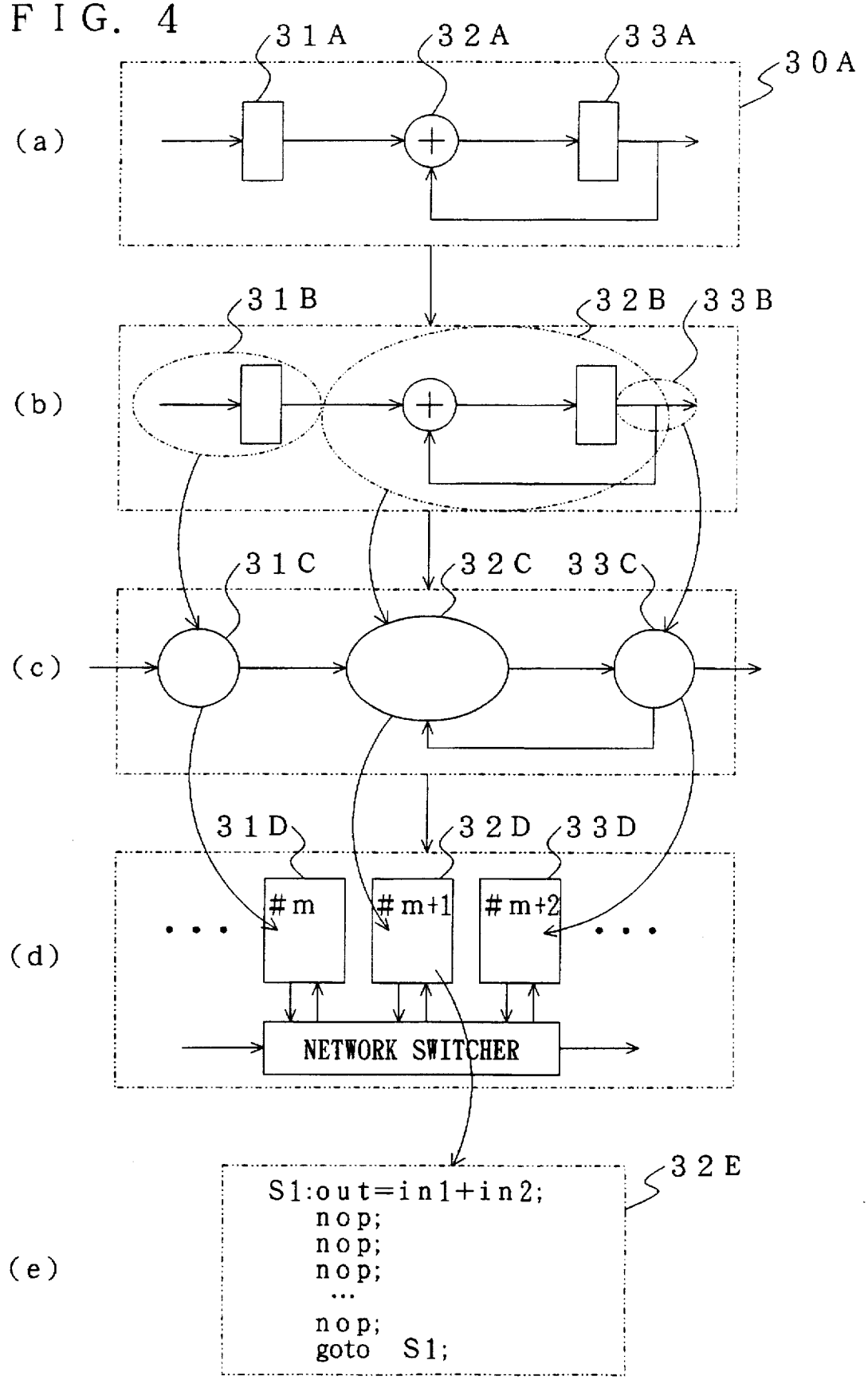

The procedure for program generation performed by the simulation program generating means 14 shown in FIG. 1 will be described below with reference to FIGS. 3 and 4. FIG. 3 is a flowchart showing the procedure for program generation. FIGS. 4(a) to 4(e) are typical diagrams showing the procedure for program generation.

At a partial data path generating step S1 shown in FIG. 3, a data path for signal processing at the register transfer level in a net list is divided into each partial data path for an input portion, registers or an output portion. As an example of a digital signal processing circuit having a register 31A, an adder 32A and a register 33A connected in series in a net list 30A shown in FIG. 4(a), the step S1 corresponds to data path generation performed by dividing the input portion and the register 31A, the adder 32A and the register 33A, and the output portion into first, second and third partial data paths 31B, 32B and 33B respectively as shown in FIG. 4(b).

At a partial pass net list creating step S2 shown in FIG. 3, each partial data path generated at the partial data path generating step S1 acts as an element to create a partial pass net list which represents connection corresponding to an original net list. At the step S2, the first, second and third partial data paths 31B, 32B and 33B shown in FIG. 4(b) correspond to first, second and third partial pass net lists 31C, 32C and 33C respectively as shown in FIG. 4(c).

At a unit allocating step S3 shown in FIG. 3, each partial pass net list created at the partial pass net list creating step S2 is mapped on the digital signal processing system 13. At the step S3, the partial data paths 31B, 32B and 33B shown in FIG. 4(b) are allocated corresponding to suitable signal processing units 31D, 32D and 33D of the digital signal processing system 13 as shown in FIG. 4(d) to obtain the connection of the partial pass net lists 31C, 32C and 33C shown in FIG. 4(c). Thus, the connection between the processing units is determined.

At a program generating step S4 shown in FIG. 3, a program is generated for the signal processing units 31D, 32D and 33D to which the partial data paths 31B, 32B and 33B are allocated respectively, wherein operation of each corresponding partial data path is performed and the result of the operation is output with a processing delay that is coincident with the data input cycle of a test vector by inserting the suitable delay cycle.

For example, a program 32E shown in FIG. 4(e) is generated for the second signal processing unit 32D to which the second partial data path 32B is allocated. Then, the simulation program generating means 14 down loads the simulation program 32E generated by software on a computer and the like from the external output channel of the computer into the digital signal processing system 13.

Then, the program which is down loaded into each of the signal processing units 31D, 32D and 33D repeatedly executes the same instruction step in a cycle that is coincident with the input cycle of the data of the test vector.

According to the present embodiment, the simulation program has a predetermined processing delay which corresponds to the data input cycle of the test vector obtained based on the clock cycle of a simulated signal processing circuit shown in FIG. 4(d) and the data transfer time for registers which is synchronized with the clock cycle. Consequently, the circuit simulation of the digital signal processing circuit at the register transfer level can be executed surely and the throughput that is coincident with the transfer speed of input data can be obtained.

The structure of the control means 15 shown in FIG. 1 will be described below with reference to FIG. 5. The control means 15 outputs each signal for controlling the whole apparatus for simulating a digital signal processing circuit according to the present embodiment.

Figure 5:
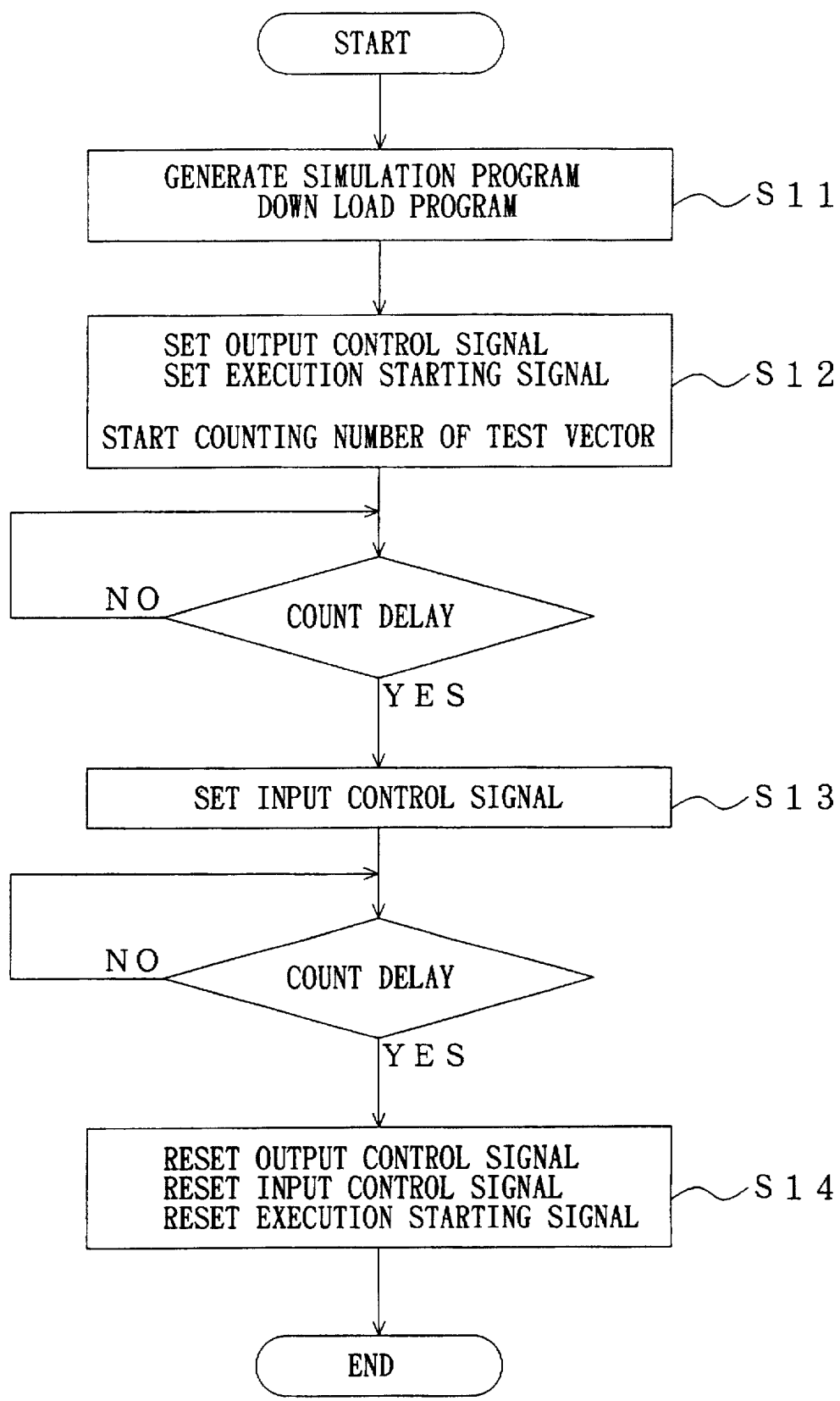
FIG. 5 is a flowchart showing the procedure for control of control means of the apparatus for simulating a digital signal processing circuit according to the first embodiment of the present invention.

At a program generating step S11 shown in FIG. 5, when the control means 15 shown in FIG. 1 outputs a starting signal 105 to the simulation program generating means 14, the simulation program generating means 14 shown in FIG. 1 generates, on receipt of the starting signal 105, a simulation program from the net list of the simulated signal processing circuit which is obtained as a result of design of the digital signal processing circuit and then down loads the simulation program into the digital signal processing system 13 shown in FIG. 1.

At an execution start directing step S12 shown in FIG. 5, the control means 15 shown in FIG. 1 outputs an output control signal 101 to the test vector storing means 11 to cause the test vector storing means 11 to output a test vector, and outputs an execution starting signal 104 to the digital signal processing system 13 to start the simulation program which has been down loaded thereinto. At the same time, an internal counter is reset to start counting the number of test vectors output from the test vector storing means 11.

At an input control directing step S13 shown in FIG. 5, after counting the number of data corresponding to a delay in which each sample data is input to the digital signal processing system 13 and executed by the simulation program and the result of simulation is output, the control means 15 shown in FIG. 1 turns on the input control signal 103 to direct the input to the simulation result storing means 12.

At an execution stop directing step S14 shown in FIG. 5, when the count number of the internal counter reaches a count value obtained by adding the number of data of the test vector and the number of data for the delay counted at the input control directing step S13, the output control signal 101, the input control signal 103 and the execution starting signal 104 are turned off to terminate the simulation.

The operation of the simulation apparatus is synchronized with the clock signal 102. Data transfer between components is also synchronized with the clock signal 102.

The simulation operation of the apparatus for simulating a digital signal processing circuit having the above-mentioned structure will be described below with reference to the drawings.

Figure 6:
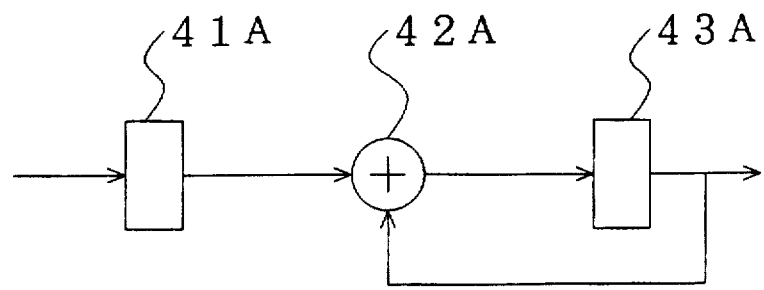
FIG. 6 is a circuit diagram showing the simulated processing circuit of the apparatus for simulating a digital signal processing circuit according to the first embodiment of the present invention.

FIG. 6 is a circuit diagram showing an example of the simulated signal processing circuit which is obtained as a result of functional design of the digital signal processing circuit. The simulated signal processing circuit shown in FIG. 6 has a register 41A, an adder 42A and a register 43A connected in series. The output values of the register 41A and the register 43A are added together. The result of addition is input to the adder 42A.

Figure 7:
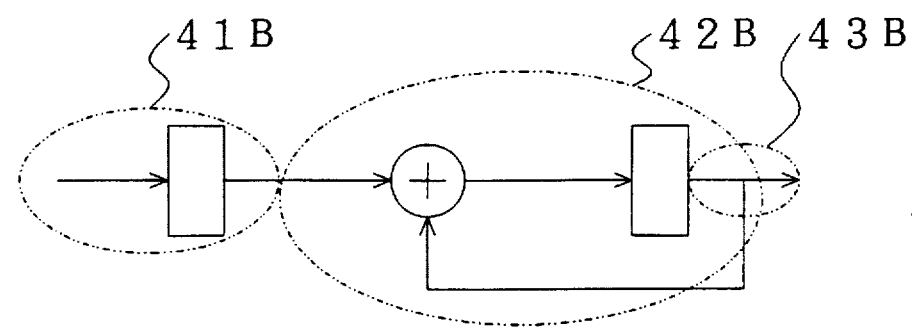
FIG. 7 is a diagram showing partial pass division of the simulated signal processing circuit of the apparatus for simulating a digital signal processing circuit according to the first embodiment of the present invention.

In the case where the simulation program is generated, the simulation program generating means 14 shown in FIG. 1 converts the net list at the register transfer level of the signal processing circuit shown in FIG. 6 into a partial pass net list in which an input portion and the register 41A correspond to a first partial pass 41B, the adder 42A and the register 43A correspond to a second partial pass 42B, and an output portion corresponds to a third partial pass 43B as shown in FIG. 7.

Figure 8:
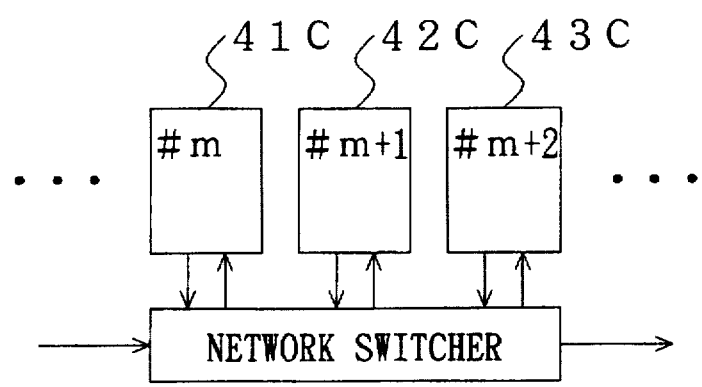
FIG. 8 is a diagram showing the structure of signal processing units which are allocated to the simulated signal processing circuit of the apparatus for simulating a digital signal processing circuit according to the first embodiment of the present invention.

The partial passes 41B, 42B and 43B shown in FIG. 7 are allocated to signal processing units 41C, 42C and 43C of the digital signal processing system shown in FIG. 8 respectively to generate the simulation program and a connection control code for determining the connection of data input-output channels between the signal processing units. The data output cycle of the test vector storing means 11 shown in FIG. 1, that is, the data input cycle of the digital signal processing system 13 shown in FIG. 1 is represented by P. The programs generated from the partial passes 41B, 42B and 43B have a processing delay P. Consequently, only the program generated from the second partial pass 42B adds two input values together.

Simulation programs generated from the partial passes 41B, 42B and 43B shown in FIG. 7 are down loaded into the signal processing units 41C, 42C and 43C shown in FIG. 8. The first signal processing unit 41C inputs a test vector from the test vector storing means 11 shown in FIG. 1 and outputs data to the second signal processing unit 42C. The second signal processing unit 42C inputs data from the first signal processing unit 41C and the third signal processing unit 43C at the same time, adds the input data together, and outputs the result of addition to the third signal processing unit 43C. The third signal processing unit 43C inputs data from the second signal processing unit 42C, and outputs the same data to the simulation result storing means 12 shown in FIG. 1. The processing delay of each of the signal processing units 41C, 42C and 43C is represented by P. Therefore, a processing delay per sample data of the digital signal processing system 13 is 3P in total.

A simulation executing control timing will be described below with reference to FIG. 9, in which the number of data of the test vector is k (k is an integer which is equal to or more than 1).

Figure 9:
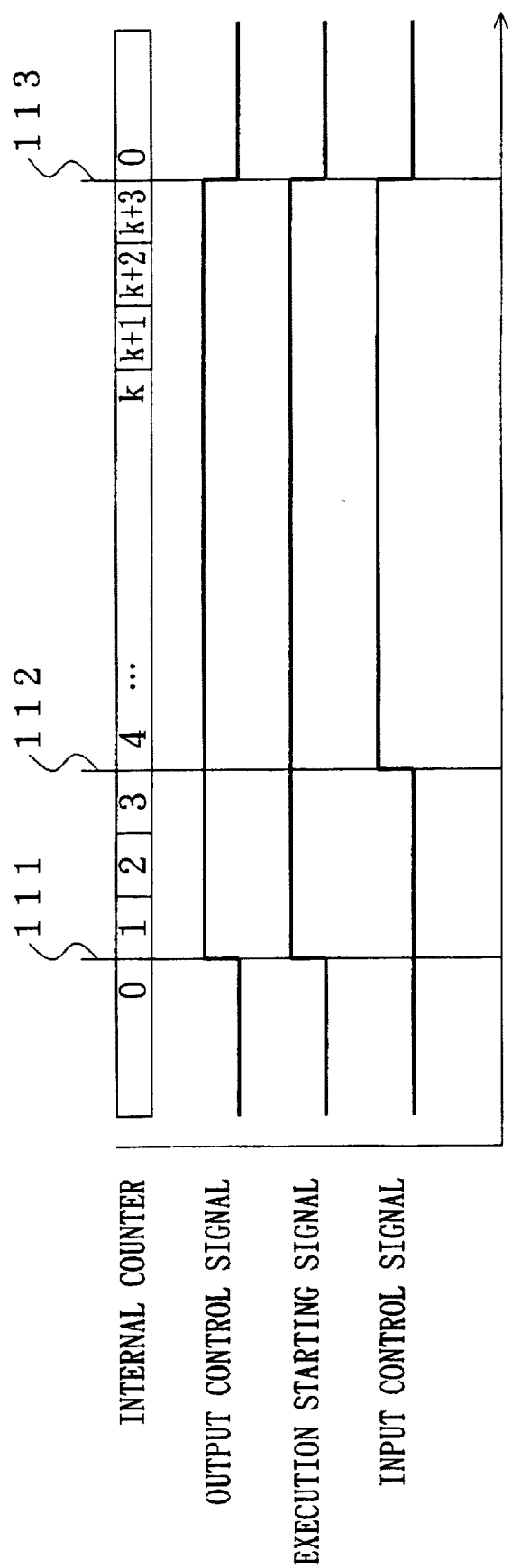
FIG. 9 is a timing chart showing the control timing of simulation of the control means of the apparatus for simulating a digital signal processing circuit according to the first embodiment of the present invention.

FIG. 9 is a timing chart showing the timing of the output control signal 101, the input control signal 103, the execution control signal 104 and the count value of the internal counter in the control means 15 shown in FIG. 1. An execution starting timing 111 shown in FIG. 9 indicates the termination of the down load of the simulation program. At this time, the control means 15 outputs the output control signal 101 to the test vector storing means 11 and starts counting the number of data of the test vector, and the digital signal processing system 13 starts the simulation processing.

As shown in FIG. 9, the first simulation result is output at a time 112 after a time 3P has passed since the execution starting timing 111. The control means 15 outputs an input control signal to the simulation result storing means 12 shown in FIG. 1. The simulation result storing means 12 starts inputting data on the simulation result. The number of data of the test vector is k. Consequently, all the simulation results are stored in the simulation result storing means 12 at an execution terminating timing 113 after a time (k+3)×P has passed since the execution starting timing 111. Thus, the simulation is completed.

For example, a clock signal allows about 10 clocks, that is, a program allows about 10 steps in such a manner that the processing for simulation programs corresponding to the partial passes can be completed for the input data cycle P.

According to the present embodiment, a program for simulating the operation of the registers of the data paths of the simulated circuit in the data input cycle of a predetermined data speed is generated, down loaded into the signal processing system, and executed by synchronizing the test vector storing means with the simulation result storing means in the cycle P. Consequently, the overhead caused by I/O of the storing means is not increased. Therefore, the test vector and the result of operation are always transferred at a predetermined data speed irrespective of the number of data of the test vector. As a result, the simulation can be completed in a time that is proportional to the number of data of the test vector.

In particular, simulation is performed by allocating a predetermined delay (=P) to the data input cycle P obtained based on the clock cycle of the simulated signal processing circuit and the data transfer between registers which is synchronized with the clock signal. Consequently, a control mechanism for simulating the synchronization of the data transfer between registers is not necessary. In addition, the throughput which is coincident with the transfer speed of input data can be obtained.

(Second Embodiment)

A second embodiment of the present invention will be described below with reference to the drawings.

Figure 10:
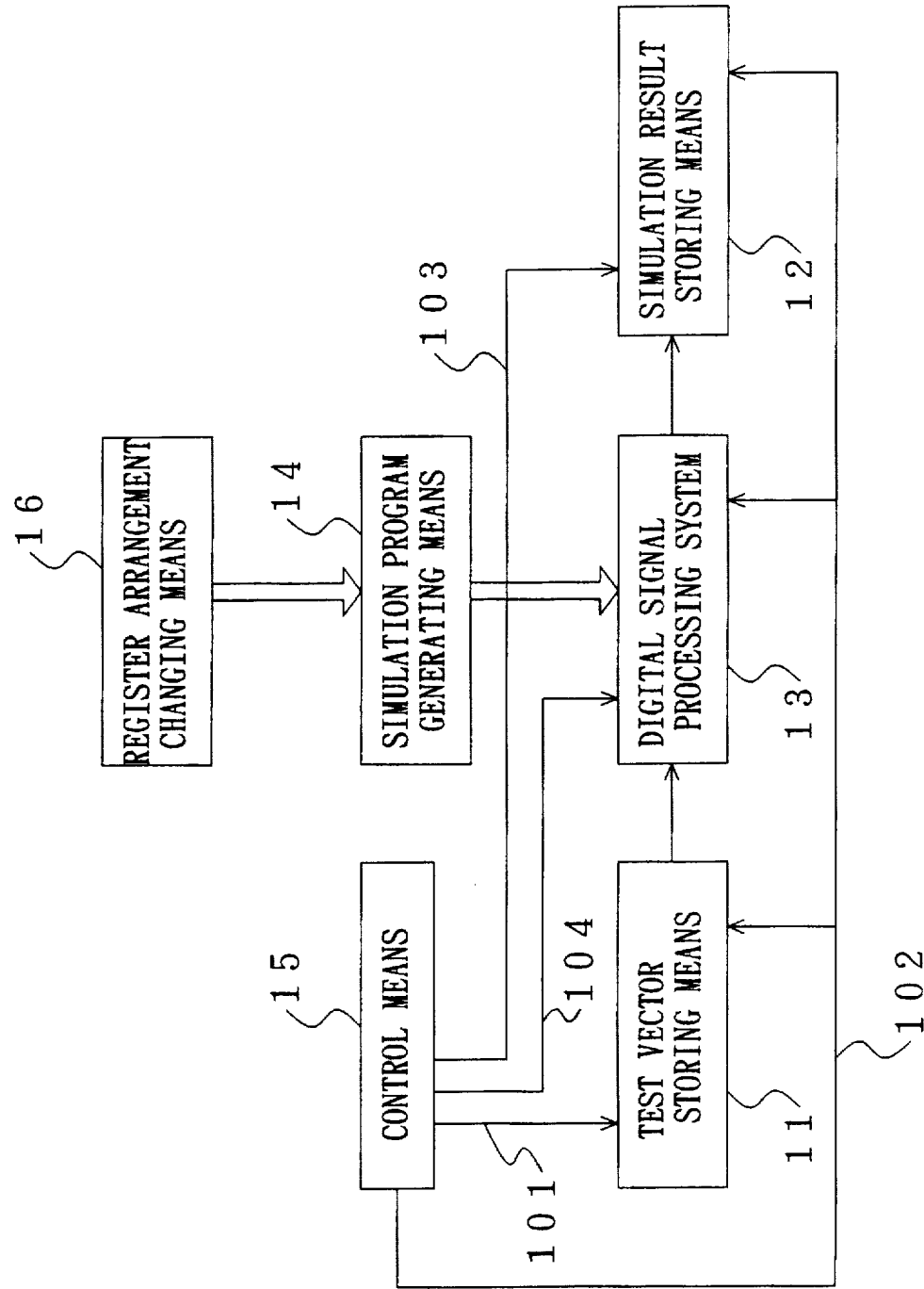
FIG. 10 is a block diagram showing the structure of an apparatus for simulating a digital signal processing circuit according to a second embodiment of the present invention.

FIG. 10 is a block diagram showing the structure of an apparatus for simulating a digital signal processing circuit according to the second embodiment of the present invention. In FIG. 10, the same reference numerals designate the same components as in FIG. 1 and their description will be omitted. In FIG. 10, register arrangement changing means 16 is provided as a new component. The register arrangement changing means 16 can change the arrangement of registers on the data path of a digital signal processing circuit. In other words, the register arrangement changing means 16 inputs a net list at the register transfer level which is obtained as a result of design of the digital signal processing circuit, changes the arrangement of the registers so as not to cause a difference in circuit operation in the case where all the components of the digital signal processing circuit have a delay of 0, and outputs a net list in which the registers are moved for connection.

Simulation program generating means 14 generates a simulation program by regarding, as a partial pass, a partial pass for transferring data to the registers which are continuously connected and a partial pass in which the registers are directly connected for the net list of the digital signal processing circuit generated by the register arrangement changing means 16. At this time, a processing delay for register stages is set.

Figure 11:
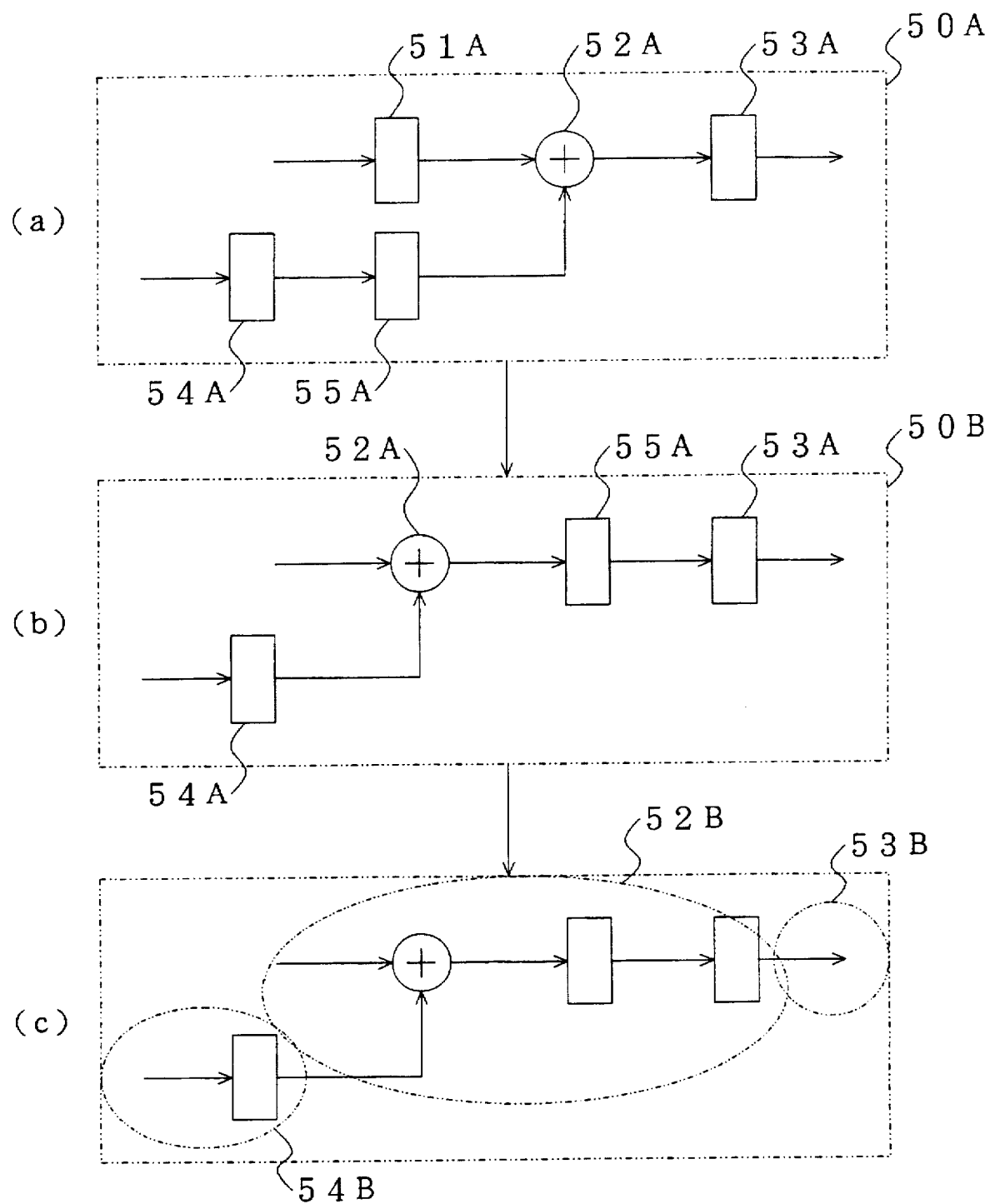

More specifically, a method for generating a simulation program will be described below by using the data path of the digital signal processing circuit shown in FIGS. 11(a) to 11(c). As shown in FIG. 11(a), a data path 50A has a register 51A, an adder 52A and a register 53A connected in series, and has a register 54A and a register 55A connected in series. The adder 52A inputs a value obtained by adding the output values of the register 51A and the register 55A.

As shown in a data path 50B of FIG. 11(b), the register arrangement changing means 16 shown in FIG. 10 moves the register 55A of the data path 50A shown in FIG. 11(a) to a portion between the adder 52A and the register 53A.

As shown in FIG. 11(c), the simulation program generating means 14 shown in FIG. 10 divides the data path 50B into a first partial pass 54B, a second partial pass 52B and a third partial pass 53B respectively as described above. In particular, the simulation program generating means 14 generates, from the second partial pass 52B, a program which sets a processing delay 2P for an input data cycle P.

According to the present embodiment, even if a partial pass which cannot be operated with a delay within the input data cycle P exists on the data path of the digital signal processing circuit because of a large quantity of operation, the processing delay can be added and enlarged by integrating the same partial pass and a prior or posterior partial pass when generating the simulation program. Thus, the circuit range to which the simulation apparatus of the present invention is applied can be expanded.

(Third Embodiment)

A third embodiment of the present invention will be described below with reference to the drawings.

Figure 12:
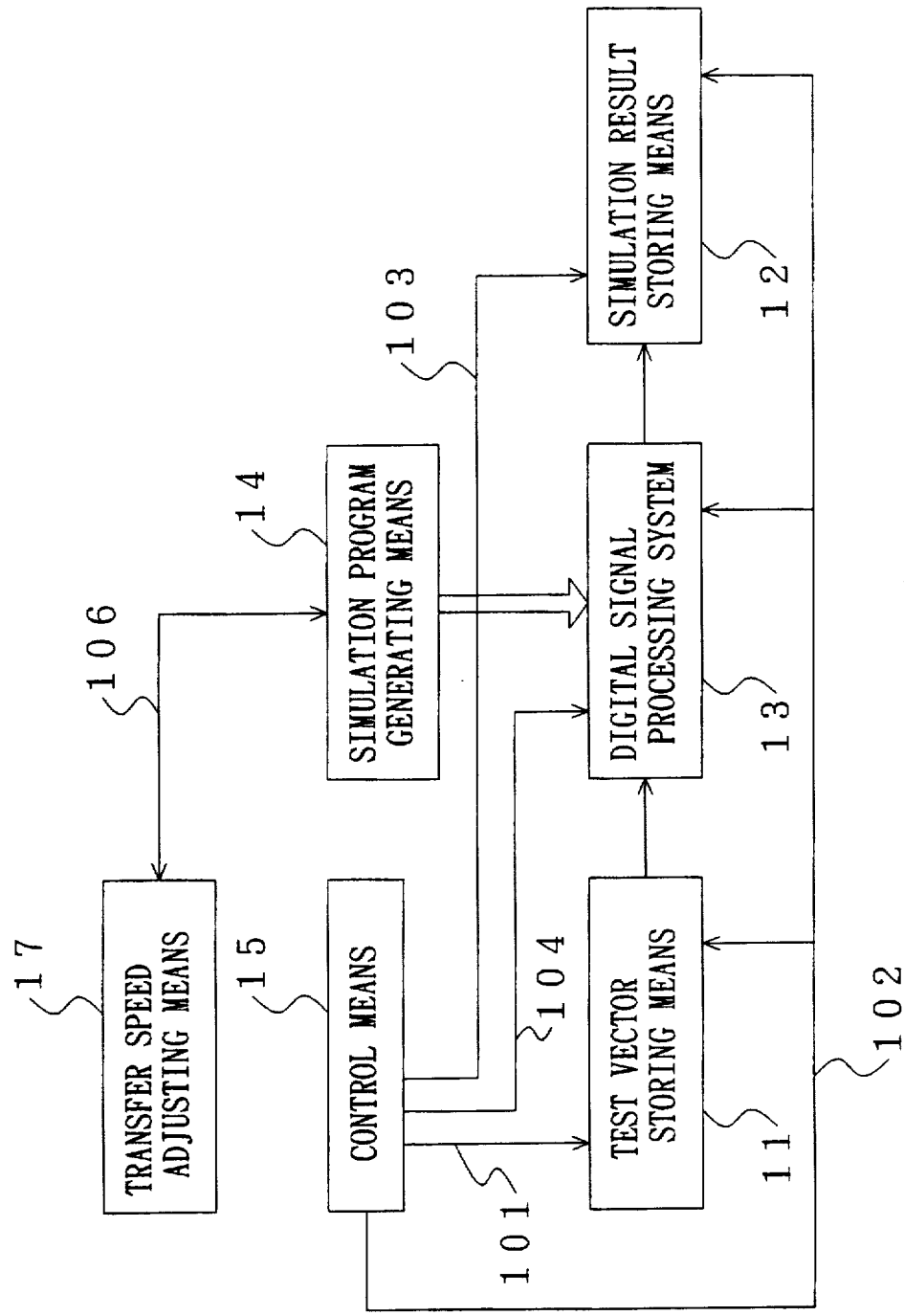
FIG. 12 is a block diagram showing the structure of an apparatus for simulating a digital signal processing circuit according to a third embodiment of the present invention.

FIG. 12 is a block diagram showing the structure of an apparatus for simulating a digital signal processing circuit according to a third embodiment of the present invention. In FIG. 12, the same reference numerals designate the same components as in FIG. 1 and their description will be omitted. In FIG. 12, transfer speed adjusting means 17 is provided as a new component. The transfer speed adjusting means 17 can adjust the data transfer speed of test vector storing means 11 and that of simulation result storing means 12 according to the throughput of a simulation program which can be generated by simulation program generating means 14.

The procedure for adjusting a transfer speed by the transfer speed adjusting means 17 will be described below with reference to FIG. 13.

Figure 13:
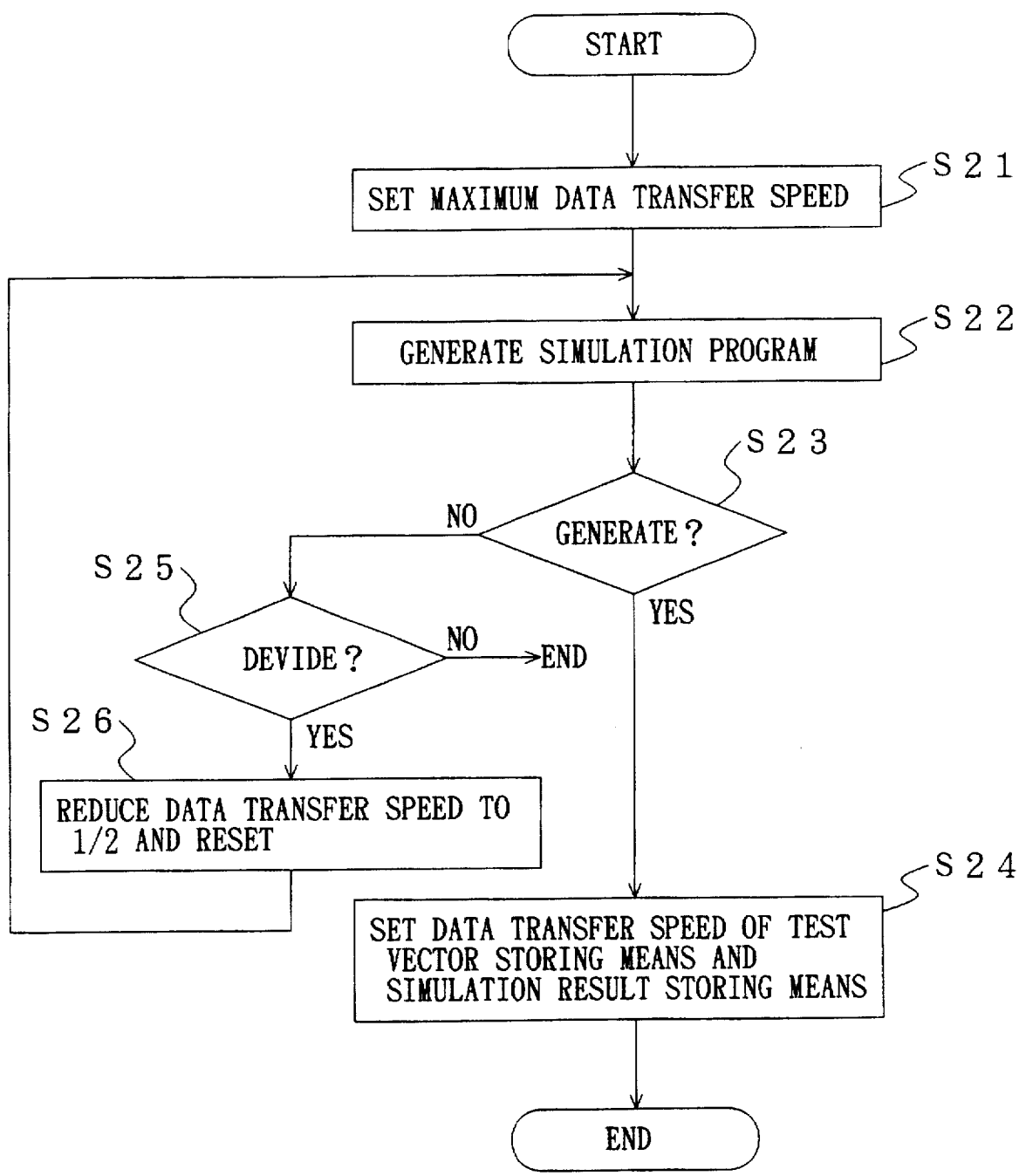
FIG. 13 is a flowchart showing the procedure of adjustment of transfer speed adjusting means of the apparatus for simulating a digital signal processing circuit according to the third embodiment of the present invention.
Figure 14:
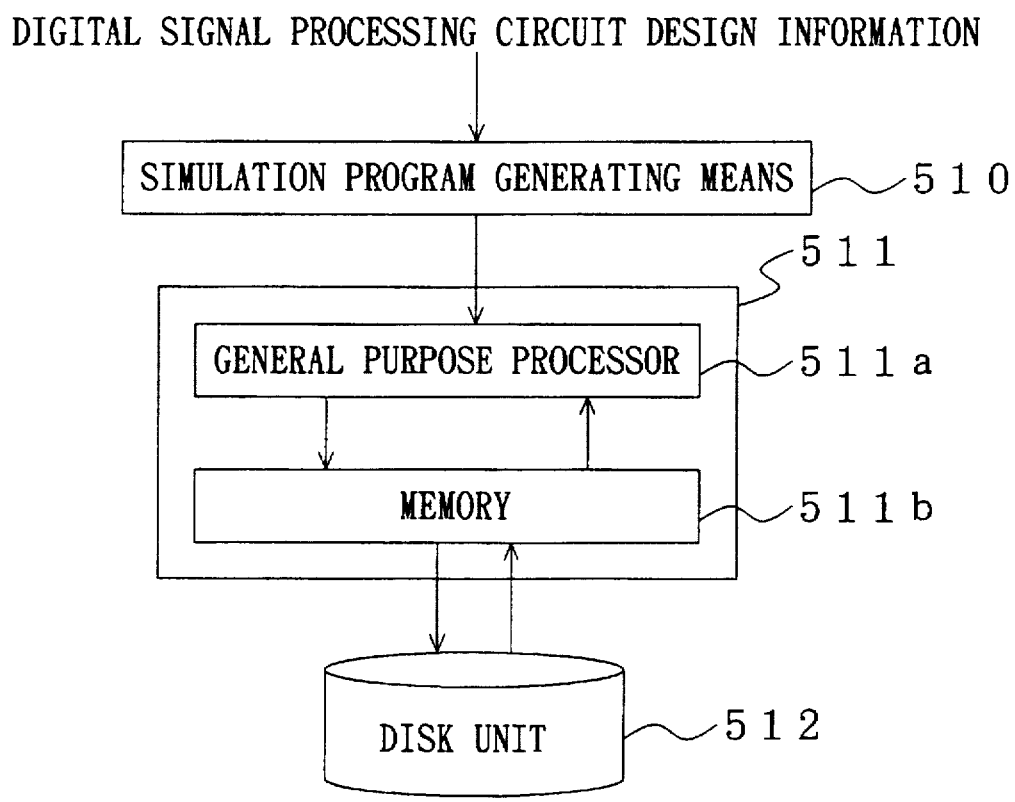
FIG. 14 is a block diagram showing the structure of a simulation apparatus of a digital signal processing circuit using a general purpose computer according to the prior art.

At an initial value setting step S21 shown in FIG. 13, the transfer speed adjusting means 17 shown in FIG. 12 sets the maximum values of a data transfer speed which can be set to the test vector storing means 11, the simulation result storing means 12 and a digital signal processing system 13, respectively.

At a program generating step S22 shown in FIG. 13, the simulation program generating means 14 shown in FIG. 12 generates a simulation program corresponding to the set data transfer speed.

At a program generation deciding step S23 shown in FIG. 13, it is decided whether a simulation program can be generated or not.

If the simulation program can be generated, the test vector storing means 11 and the simulation result storing means 12 shown in FIG. 12 are set so as to input and output data at a data transfer speed corresponding to the generated program at a data transfer speed setting step S24. Thus, the processing is completed.

If the signal processing program for executing simulation cannot be generated within an input data cycle P because of a large quantity of operation for each sample data, it is decided whether a data transfer cycle can be divided or not at a division deciding step S25. If the data transfer cycle can be divided, the data transfer speed is reduced to half at a dividing step S26. Then, the routine returns to the program generating step S22. If the data transfer cycle cannot be divided, the generation of the simulation program is stopped so that the processing is completed.

According to the present embodiment, in the case where the operation of the simulated digital signal processing circuit is complicated so that the quantity of operation for each sample data is increased and it is hard to generate a signal processing program for executing simulation at a high data transfer speed, the data transfer speed is decreased to generate the simulation program. Consequently, a large scale circuit can be simulated by using a signal processor having the limited operation resources. In addition, the simulation can be executed at a high speed because overhead for accessing the test vector and the simulation result data does not occur.

I claim:

1. An apparatus for simulating a digital signal processing circuit comprising verifying means for verifying the result of design at a register transfer level in the digital signal processing circuit by using a signal processor, the verifying means including:
test vector storing means for storing data for simulation to output the data for simulation at a predetermined transfer speed;
a signal processor for inputting the data for simulation output from the test vector storing means, executing the simulation of the digital signal processing circuit and outputting the simulation result;
simulation result storing means for inputting the simulation result output from the signal processor at a predetermined transfer speed to store the input simulation result;
simulation program generating means for generating a simulation program which is executed by the signal processor and has throughput that is coincident with the output speed of the data of the test vector storing means; and
synchronizing means for synchronizing a timing at which the data for simulation is transferred from the test vector storing means, a speed timing at which the simulation is executed by the signal processor, and a timing at which the simulation result is transferred to the simulation result storing means.

2. The apparatus for simulating the digital signal processing circuit of claim 1, wherein the simulation program generating means generates a simulation program for simulating operation between registers of a data path which is obtained as a result of design of the digital signal processing circuit.

3. The apparatus for simulating the digital signal processing circuit of claim 2, wherein the data path includes a plurality of registers;
the signal processor includes a plurality of signal processing units; and
the simulation program generating means includes partial data path generating means for dividing the data path for each register to generate a plurality of partial data paths, and unit allocating means for allocating the partial data path to the signal processing unit.

4. The apparatus for simulating the digital signal processing circuit of claim 1, wherein the verifying means further includes register arrangement changing means for changing the arrangement of the registers of the data path which is obtained as a result of design of the digital signal processing circuit.

5. The apparatus for simulating the digital signal processing circuit of claim 1, wherein the verifying means further includes transfer speed adjusting means for adjusting the transfer speed of the data for simulation of the test vector storing means and that of the simulation result of the simulation result storing means.

6. The apparatus for simulating the digital signal processing circuit of claim 5, wherein the transfer speed adjusting means adjusts the transfer speed of the data for simulation and that of the simulation result according to the throughput of the simulation program which can be generated by the simulation program generating means.

* * * * *